(12) United States Patent
Shen (10) Patent No.: US 9,927,462 B2
(45) Date of Patent: Mar. 27, 2018

(54) ELECTRICAL DEVICE TESTING FIXTURE

(71) Applicants: BOE TECHNOLOGY GROUP CO., LTD., Beijing (CN); BOE OPTICAL SCIENCE AND TECHNOLOGY CO., LTD., Suzhou, Jiangsu (CN)

(72) Inventor: Kejun Shen, Beijing (CN)

(73) Assignees: BOE TECHNOLOGY GROUP CO., LTD., Beijing (CN); BOE OPTICAL SCIENCE AND TECHNOLOGY CO., LTD., Suzhou, Jiangsu (CN)

( * ) Notice: Subject to any disclaimer, the term of this patent is extended or adjusted under 35 U.S.C. 154(b) by 50 days.

(21) Appl. No.: 14/905,095

(22) PCT Filed: May 15, 2015

(86) PCT No.: PCT/CN2015/079123
§ 371 (c)(1),
(2) Date: Jan. 14, 2016

(87) PCT Pub. No.: WO2016/119337
PCT Pub. Date: Aug. 4, 2016

(65) Prior Publication Data
US 2016/0370405 A1    Dec. 22, 2016

(30) Foreign Application Priority Data

Jan. 29, 2015 (CN) .................... 2015 2 0063921 U (51) Int. Cl.
*G01R 1/04* (2006.01)
*G01R 31/44* (2006.01)

(52) U.S. Cl.
CPC ............ *G01R 1/0416* (2013.01); *G01R 1/04* (2013.01); *G01R 1/0408* (2013.01); *G01R 31/44* (2013.01)

(58) Field of Classification Search
CPC .......... G01R 1/0416; G01R 1/04; G01R 31/44
See application file for complete search history.

(56) References Cited

U.S. PATENT DOCUMENTS

| 4,365,195 | A | * | 12/1982 | Stegens | .................... | G01R 1/04 324/750.25 |
| 5,166,605 | A | * | 11/1992 | Daum | ...................... | G01R 1/04 324/750.18 |

(Continued)

FOREIGN PATENT DOCUMENTS

| CN | 2872364 Y | * | 2/2007 |
| CN | 201199193 Y | | 2/2009 |

(Continued)

OTHER PUBLICATIONS

International Search Report and Written Opinion both dated Nov. 11, 2015; PCT/CN2015/079123.

*Primary Examiner* — Julian Huffman
*Assistant Examiner* — Michael Konczal
(74) *Attorney, Agent, or Firm* — Ladas & Parry LLP (57) ABSTRACT

An electrical device testing fixture is disclosed. The electrical device testing fixture includes a stationary base, an electrode holder, a negative electrode and a positive electrode, a stopper holder, and a stopper; the stationary base is provided with two through wire mounting holes in which wires are routed; the electrode holder is provided with two separate long slots; the two electrodes are fixed in the two long slots respectively and movable in the slots respectively; an electrical device is connected between the two electrodes; a restoring spring is provided between the stopper and the stopper holder; and the stopper is configured to fix the electrical device. The electrical device testing fixture can address the high cost problem due to the requirement of different testing fixtures corresponding to different models of electrical devices.

19 Claims, 4 Drawing Sheets

(56) References Cited

U.S. PATENT DOCUMENTS

| | | | |
|---|---|---|---|
| 8,705,023 B2* | 4/2014 | Hong .................... | G01J 1/0223 356/213 |
| 2005/0195388 A1 | 9/2005 | Huang et al. | |

FOREIGN PATENT DOCUMENTS

| CN | 201233407 Y | | 5/2009 |
|---|---|---|---|
| CN | 203148976 U | * | 8/2013 |
| CN | 203259626 U | | 10/2013 |
| CN | 203287486 U | | 11/2013 |
| CN | 104090599 A | | 10/2015 |

* cited by examiner

ELECTRICAL DEVICE TESTING FIXTURE

TECHNICAL FIELD

Embodiments of the present disclosure relate to an electrical device testing fixture.

BACKGROUND

With the development of technologies, electrical devices are applied more and more widely. For example, light emitting diodes (LEDs) have been applied in devices such as indicators, signal lamps, instrument displays and cell phone backlights due to their advantages of small volume, high brightness, low heat production and low power consumption.

In order to guarantee normal use of LEDs, it is required to test LEDs for their illumination intensity etc. with test equipments. Therefore, it is generally required to fix an LED with an LED testing fixture for LED testing. That is, the testing fixture with the LED fixed thereon is further placed on a testing equipment. With the wide application of LEDs, specifications and models of LED products have increased continuously, and a plurality of corresponding testing fixtures is provided for different specifications and models of LEDs. That is, one model of LEDs corresponds to one specific type of testing fixture to facilitate testing LEDs of different specifications.

However, LEDs are generally produced in mass. LEDs corresponding to different models require a plurality of different testing fixtures, which causes high costs.

SUMMARY

Embodiments of the present disclosure provide an electrical device testing fixture that can address the high cost problem due to the requirement of multiple different testing fixtures corresponding to different models of LEDs.

Embodiments of the present disclosure provide an electrical device testing fixture, comprising a stationary base, an electrode holder, negative electrode and positive electrode, a stopper holder and a stopper; the stationary base is provided with two wire mounting holes penetrating therethrough, and wires are routed in the wire mounting holes; the electrode holder is fixed on the stationary base and provided with two independent long slots; the two electrodes are held in the two long slots of the electrode holder respectively and movable in the long slots respectively; the two electrodes are electrically connected with corresponding wires respectively and an electrical device is connected therebetween; the stopper holder is fixed on the stationary base; and a restoring spring is provided between the stopper and the stopper holder; and the stopper is configured to fix the electrical device.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF EMBODIMENTS

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The electrical device testing fixture according to embodiments of the present disclosure will be described in detail below with reference to accompanying drawings.

Figure 1:
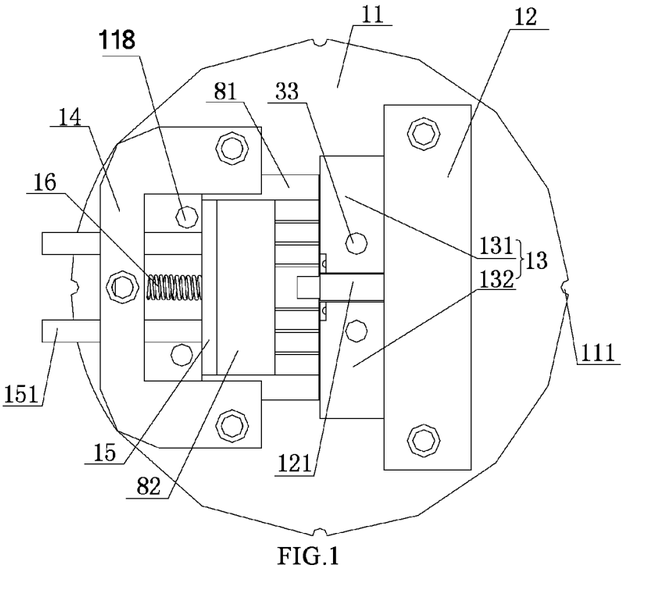
FIG. 1 is a top view of an electrical device testing fixture provided in an embodiment of the present disclosure.
Figure 2:
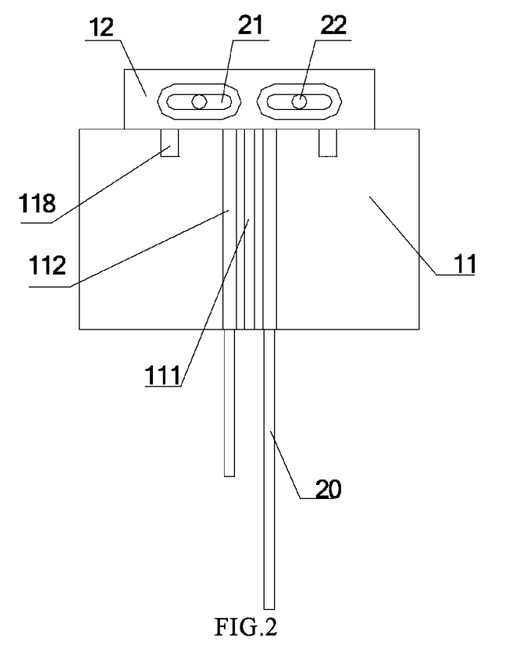
FIG. 2 is a side view of an electrical device testing fixture provided in an embodiment of the present disclosure.

An embodiment of the present disclosure provides an electrical device testing fixture as shown in FIGS. 1 and 2, including a stationary base 11, an electrode holder 12, positive and negative electrodes 13, a stopper holder 14, and a stopper 15.

The stationary base 11 is provided with two wire mounting holes 112 extending therethrough, and both of the wire mounting holes are provided with wires 20. The wire mounting holes are represented with dashed lines in the drawing because they are provided in the stationary base 11 and invisible from sides.

The electrode holder 12 is fixed on the stationary base 11 and provided with two independent long slots 21.

The two electrodes 13 are fixed in the two long slots 21 of the electrode holder 12 respectively and are movable in the corresponding long slots 21. The two electrodes 13 are electrically connected with corresponding wires 20 respectively, and an electrical device 1 is connected therebetween.

The stopper holder 14 is fixed on the stationary base 11.

A restoring spring 16 is provided between the stopper 15 and the stopper holder 14, and the stopper 15 is configured to fix the electrical device 1.

In the electrical device testing fixture provided in the embodiment of the present disclosure, electrode holders are provided on the stationary base, and the stationary base is provided with wires passing therethrough. Negative and positive electrodes are fixed in long slots of the electrode holders respectively and are movable in the long slots. An electrical device is connected between two electrodes and fixed by a stopper provided on the stopper holder. As can be known, with an LED being taken as an example of the electrical device, when the LED needs to be tested, the restoring spring is compressed by moving the stopper away from electrodes, thereby facilitating the connection between the LED and the electrodes. After the positive and negative electrodes of the LED are connected accordingly with the negative and positive electrodes, the stopper is released to return back to the original position under the action of restoring spring, so as to fix the LED and facilitate subsequent testing. In this process, the LED is connected between two electrodes, and each electrode can move in respective long slot, thereby being able to change spacing between two electrodes as required and thus connect with LEDs of different specifications and models accordingly. This electrical device testing fixture has strong universality and can reduce testing costs. Also, usually, a novel type of LEDs are developed first, while testing fixtures corresponding to the novel LEDs need to be developed subsequently, which causes LED test can not be carried out in time for normal use. While the electrical device testing fixture provided in embodiments of the present disclosure can be applicable to LEDs of different specifications due to the adjustable spacing between electrodes, and can implement tests of novel LEDs in time, thereby facilitating use.

It is to be noted that, the electrical device testing fixture in embodiments of the present disclosure is generally used to test LEDs, and of course can be used to test other electrical devices as well. Embodiments of the present disclosure will be described with respect to testing an LED as an example.

In order to facilitate description, electrodes 13 are configured to include a negative electrode 132 and a positive electrode 131.

As can be known from the above-described fixing process, the LED needs to be connected between two electrodes, that is, the LED's positive electrode is connected with the positive electrode 131, the LED's negative electrode is connected with the negative electrode 132, and a positive electrode 131 and a negative electrode 132 are connected with a wire 20 respectively, thereby supplying power to the LED.

Figure 3:
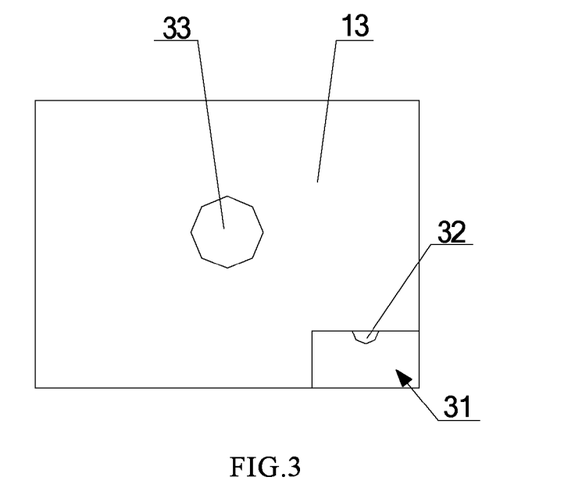
FIG. 3 is a top view of an electrode structure of an electrical device testing fixture provided in an embodiment of the present disclosure.

In order to improve the stability of connection between LED and electrodes 13, it is possible to control the magnitude of pressure against the LED by the stopper 15 or take the measure as shown in FIGS. 1 and 3. The electrode 13 shown in FIG. 3 may be a negative electrode 132 or a positive electrode 131. Depressions 31 are provided on the tops of the opposite sides of the negative electrode and the positive electrode (132, 131) that are apart from the stationary base 11 and the electrode holder 12, namely, corners adjacent to two electrodes 13 in FIGS. 1 and 3. The depressions 31 are in a rectangle shape. Therefore, two depressions 31 together form a rectangular frame that conforms to the LED's structure. Of course, the depressions' structure can also be modified according to the LED's structure. For example, probes 32 are provided in the depressions 31, and the probes 32 are connected with the positive and negative electrodes of the LED respectively, and this configuration can improve reliability of connection between the electrode 13 and the LED's pins and ensure a good contact. In this way, when the LED is connected with the probes 32, the LED is placed in the depressions 31. It is required to guarantee that, on a side of electrode 13 that faces stopper 15, the LED is aligned with or extend beyond the front end surface of electrode 13, because the depth of the depression 31 on each electrode needs to guarantee that the stopper 15 can press against the LED smoothly.

In practical applications, it is required to place the testing fixture mounted with an LED provided in embodiments of the present disclosure on the testing equipment for LED test, while the testing fixture provided in embodiments of the present disclosure can be applied to LEDs of different specifications and models. Therefore, in order to improve use repeatability of the testing fixture, as shown in FIGS. 1 and 2, scribed lines 111 (which may be grooves with the same function too) may be provided on the stationary base 11. For example, the stationary base 11 may be a cylinder, and the above-mentioned scribed lines 111 are provided on the sidewall of the cylinder for example. Further, there may be a plurality of scribed lines 111. In FIG. 2, four scribed lines are provided on the sidewall of the stationary base 11 and arranged evenly with an equal spacing therebetween. In operation, it is possible to set opposite two scribed lines 111 to be orthogonal to each other to facilitate uniform operation.

For example, the wire mounting holes are located in the central region of the stationary base 11, and may be of elongate circle holes or rectangular holes, thereby facilitating adjustment of wires 20. As can be known with reference to FIGS. 1 and 3, each electrode 13 is provided with a through hole 33 penetrating through from top to bottom in the direction perpendicular to the stationary base 11. Therefore, wires 20 penetrating through the mounting holes can penetrate through the through hole 33 to accomplish electrical connection between electrodes 13 and wires 20.

Figure 4:
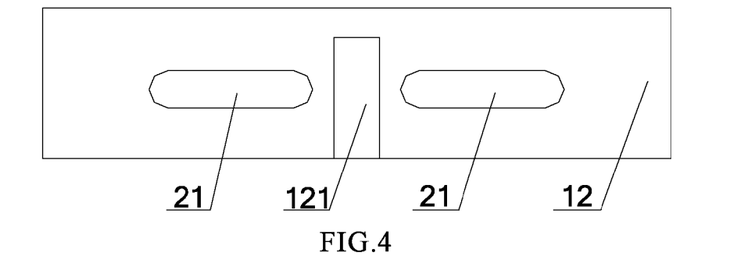
FIG. 4 is a front view of an electrode holder structure of an electrical device testing fixture provided in an embodiment of the present disclosure.
Figure 5:
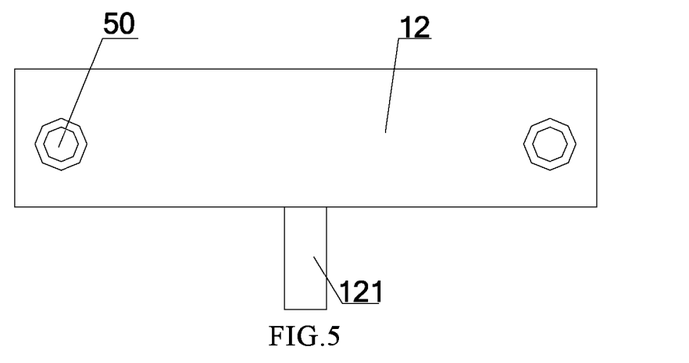
FIG. 5 is a top view of an electrode holder structure of an electrical device testing fixture provided in an embodiment of the present disclosure.
Figure 6:
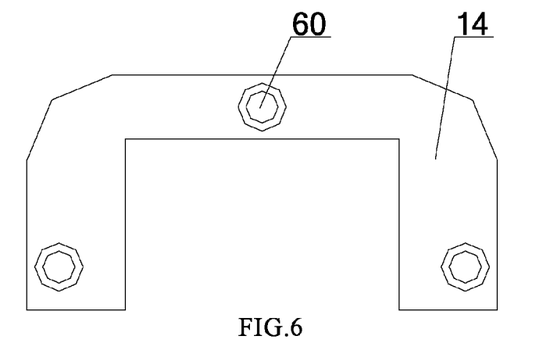
FIG. 6 is a top view of an stopper holder structure of an electrical device testing fixture provided in an embodiment of the present disclosure.
Figure 7:
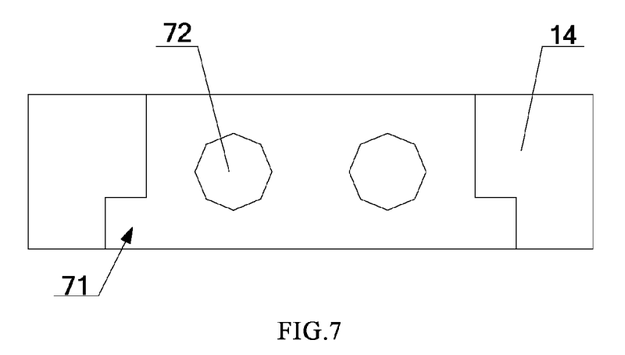
FIG. 7 is a front view of an stopper holder structure of an electrical device testing fixture provided in an embodiment of the present disclosure.

As shown in FIGS. 4 and 5, the electrode holder 12 is for example of a cuboid structure and may be connected and fixed with the stationary base 11 by means of threaded connection, pin connection or the like. At this point, the electrode holder 12 is provided with threaded mounting holes 50 etc. On the electrode holder 12, two separate long slots 21 are disposed symmetrically to facilitate to hold the electrodes in the long slots 21 and allow them to slide therein as well. As shown in FIG. 2, it is possible to provide a through bolt hole 22 in a direction perpendicular to the electrode holder 12, in which a blot is disposed and fixed in the long slot 21 respectively by a nut, whereby the location and fixation of electrodes 13 can be adjusted by screwing of the nut. That is, when it is desired to adjust the positions of electrodes 13, the nut is screwed to achieve location adjustment of electrodes 13. When the electrodes 13 are adjusted in place, the electrodes 13 are fixed by fastening the nut.

In order to guarantee an overall installation in order, the long slots 21 on sides where nuts are located can be formed with a counter bore structure. That is, there is a space for containing and also position-limiting the nut.

Additionally, as shown in FIG. 1, the two electrodes 13 are close to each other. Therefore, while adjusting locations, mis-operations such as contact between the two electrodes 13 tend to occur, causing electrical short. Therefore, as shown in FIGS. 1, 4 and 5, a bump 121 can be provided on the electrode holder 12 between the two long slots 21 to effectively isolate two electrodes 13 and ensure safety. Further, upon assembling, the bump 121 can also function as a secondary support. At the same time, since the bump 121 is constant in location and structure, it can also have function of positioning upon adjustment, fixing of electrodes 13 and subsequent LED connection, hence facilitating assembling.

In the process of adjusting positions of electrodes 13, an LED is to be mounted subsequently between the two electrodes 13. Therefore, it is possible to adjust the two electrodes 13 simultaneously to center the LED connected thereto and facilitate fixing.

Of course, the connection between the electrode 13 and the electrode holder 12 may also be realized in other ways. For example, the two components are connected with a screw stem etc., as long as the spacing between two electrodes 13 can be adjusted.

When the probes of the two electrodes 13 are connected with an LED, they need to be fixed by the stopper 15 to prevent fixation of the LED from loosing. For example, it is possible to fix the LED by pressing the stopper against the LED. By controlling the pressure against LED applied by the stopper, it is possible to guarantee that the stopper would not damage the LED in pressing while fixing the LED. In FIG. 1, the stopper 15 and the stopper holder 14 are connected fixedly. By providing a restoring spring 16 between the stopper 15 and the stopper holder 14, the pressing against the LED by the stopper 15 may be achieved. That is, when the stopper 15 is in its initial position (the position of the stopper in FIG. 1), the restoring spring 16 is in a compressed state.

For example, referring to FIGS. 6 to 9, the stopper holder 14 is of a U-shape structure in which the stopper 15 is located, and the stopper holder 14 may be fixed on the stationary base 11 by means such as threaded screw connection. In this way, the stopper holder 14 is provided with threaded holes 60. Thus, the stopper holder 14 of the U-shape structure forms a space for containing the stopper to facilitate reciprocation movement of stopper 15. The stopper holder 14 is provided with a sliding groove 71 at the bottom, and correspondingly, protruding sliders 81 are provided on both sides of the stopper 15. Thereby, with the cooperation between sliders 81 and sliding groove 71, smooth reciprocation movement of the stopper 15 is guaranteed. In this way, in order to further improve stable motion and quick installation of the stopper 15, as shown in FIG. 1, at least one (e.g., two symmetrical cylindrical guiding posts 151) is disposed on the back end surface of the stopper, which end surface is apart from the electrodes 13. Correspondingly, guiding holes 72 are provided on the stopper holder 14, and the guiding posts 151 are disposed through the guiding holes 72 and connected through a bearing. That is, bearings are disposed at the guiding holes such that the stopper 15 reciprocates in the extension direction of the guiding post 151. Of course, it may also be implemented by providing only guiding posts 151 on the condition that the stable motion of the stopper 15 can be guaranteed.

For example, as can be known from FIG. 1, the restoring spring 16 may be disposed between the two guiding posts 151 with one end being fixedly connected with the back end surface of stopper 15 and the other end being fixedly connected with the stopper holder 14. In application, the stopper 15 is moved first to separate the stopper 15 and the electrodes 13 and compress the restoring spring 16. Then an LED is connected onto the probes 32 of the two electrodes 13. After the LED is connected, the stopper 15 is released and return to its original position under the action of the restoring spring to thereby smoothly press against the LED for accomplishing fixation of the LED on the electrode 13. That is, the fixing and installation of LED is completed. Subsequent LED testing is facilitated.

Figure 10:
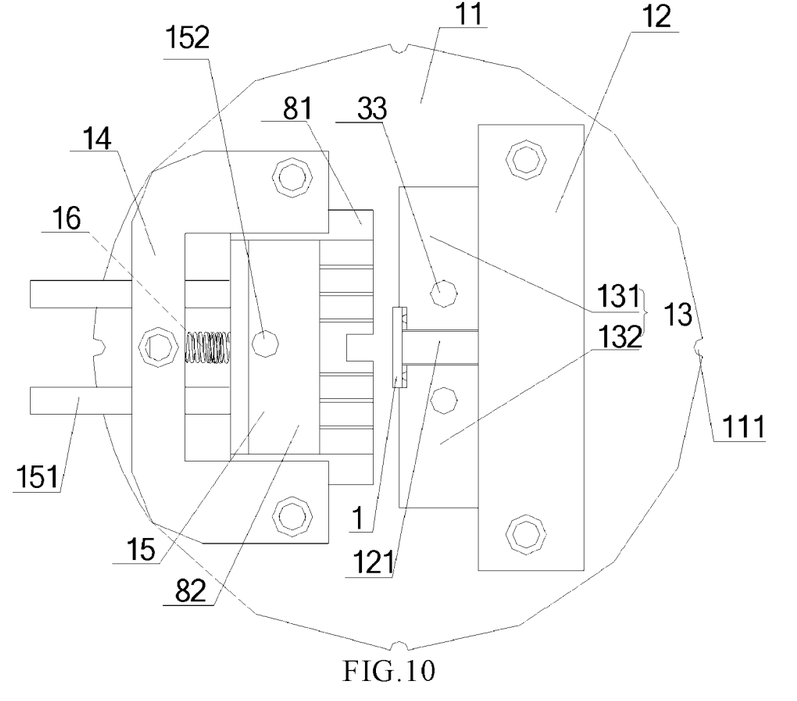
FIG. 10 is a diagram of mounting an electrical device with an electrical device testing fixture provided in an embodiment of the present disclosure.

Of course, in order to facilitate connecting of the LED to the electrodes 13, it is possible to dispose a clamping hole 118 on the stationary base 11 as shown in FIGS. 1 and 2. In FIG. 2, the clamping hole 118 is invisible from side because it's placed in the stationary base 11 and thereby denoted with dashed lines. FIG. 10 shows a diagram of mounting an electrical device with an electrical device testing fixture. After moving the stopper 15 away from the electrodes 13 to a suitable place, the clamping fixation of stopper 15 is accomplished by inserting a clamping block 152 in the clamping hole. After the LED is connected, the clamping block is removed to release the stopper 15, allowing the stopper 15 to press against and fix the LED smoothly. The number of clamping holes 118 is for example at least one. Each clamping hole 118 is configured with a clamping block 152. In FIGS. 1 and 2, an example in which two clamping holes are configured is described.

Figure 8:
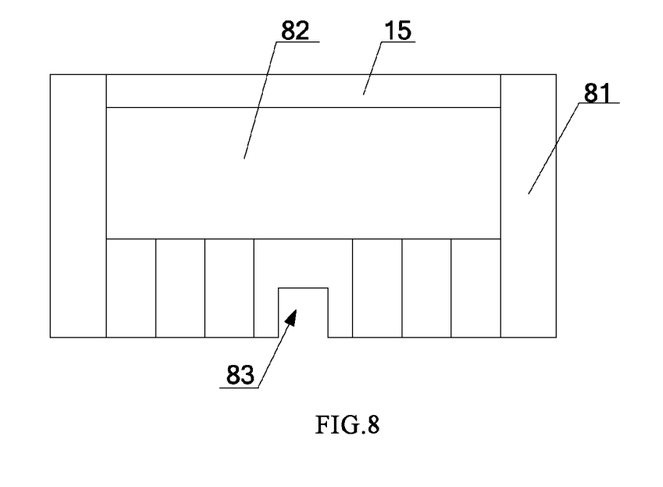
FIG. 8 is a top view of an stopper structure of an electrical device testing fixture provided in an embodiment of the present disclosure.

As can be known from the above-described process, the stopper 15 needs to be moved in the process of LED connection and testing. Accordingly, as shown in FIG. 8, a lateral U-shape groove 82 may be provided on a side of the stopper 15 that is apart from the stationary base 11, that is, the lateral U-shape groove 82 may be disposed on the top end of the stopper 15. Thus, the operator can move the stopper 15 through the U-shape groove, thereby facilitating opening and closing of the stopper 15. Of course, it is also possible to add a structure such as a handle on the top end of stopper 15.

Likewise, in order to facilitate an operator to connect the LED to the electrodes 13 or remove LED from the electrodes 13, it is possible to provide a vertical opening groove 83 in an area corresponding to the probe 32 on a front end surface of the stopper 15, which end surface is far away from the electrode 13; preferably the width of the opening groove 83 is not too large to influence the fixing effect of LED by the stopper 15. As can be known from FIG. 1, the opening groove 83 may be provided to correspond to the above-mentioned bump 121.

Figure 9:
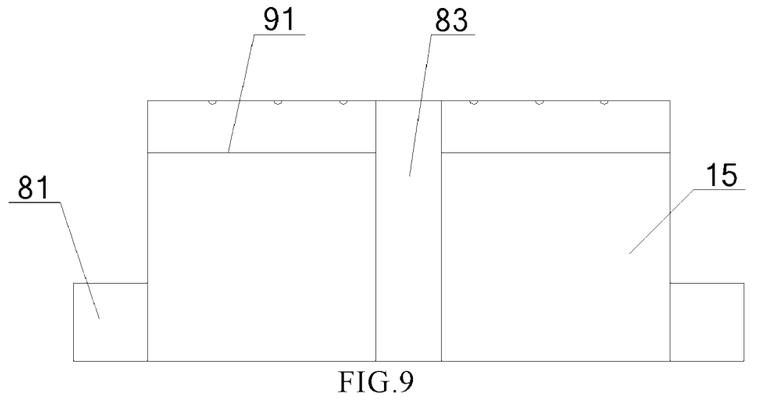
FIG. 9 is a front view of an stopper structure of an electrical device testing fixture provided in an embodiment of the present disclosure.

In FIG. 9, the front end surface of the stopper 15 that is away from the electrodes 13 may be further provided with a scale mark 91 (scale value not shown in the figure). There is a plurality of options for the positions for disposing scale mark 91, e.g., the top or bottom area of the front end surface of the stopper 15 or the top end area of the stopper 15. In the present embodiment, in order to facilitate the direct correspondence with the electrodes 13 for comparing and viewing, it is possible to dispose the scale mark 91 on the top area of the front end surface of stopper 15 and both sides of the opening groove 83. There are two scale marks 91 disposed symmetrically on both sides of the opening groove 83 in FIG. 9. The provision of the scale marks 91 facilitates comparison in adjustment of the positions of the electrodes 13, to ensure that the LED is centered and improves testing efficiency.

In the description of embodiments of the present disclosure, it is to be understood that terms "center", "on", "under", "front", "back", "left", "right", "vertical", "horizontal", "top", "bottom", "inside", "outside" or the like refer to the azimuth or position relationship based on what is shown in figures, which are only for the purpose of facilitating describing the present disclosure and simplifying description rather than indicating or implying that the mentioned devices or elements must have certain azimuth, must be constructed and operated in certain azimuth, and therefore are not constructed as limiting the present disclosure.

In the description of embodiments of the present disclosure, it is noted that unless otherwise stated and defined specifically, terms "mount", "connected with" and "connect" should be understood in a broad sense; for example, the connection may be a fixed connection, or detachable connection, or integral connection; may be a mechanical connection, or an electrical connection; may be a direct connection, or connection through a intermediate medium, or a communication inside two elements. For those of ordinary skill in the art, specific meanings of the above-mentioned terms in the present disclosure may be understood depending on specific conditions.

In the description of the specifications, specific features, structures, materials or characteristics may be combined in any suitable way in any one or more embodiments or examples.

What have been described above are only specific implementations of the present disclosure. However, the scope of the present disclosure is not limited thereto, and variations or substitutions easily occur to one skilled in the art in the scope disclosed in the present disclosure should be encompassed in the scope of the present disclosure. Therefore, the scope of the present disclosure should be based on the scope of the claims.

The present application claims priority of China Patent application No. 201520063921.2 filed on Jan. 29, 2015, the content of which is incorporated in its entirety as part of the present application by reference herein.

The invention claimed is:

1. An electrical device testing fixture, comprising a stationary base, an electrode holder, a negative electrode and a positive electrode, a stopper holder and a stopper, wherein
the stationary base is provided with two wire mounting holes penetrating therethrough, and wires are routed in the two wire mounting holes;
the electrode holder is fixed on the stationary base and provided with two independent long slots;
the two electrodes are held in the two long slots of the electrode holder respectively and movable in the long slots respectively; the two electrodes are electrically connected with corresponding wires respectively and an electrical device is connected therebetween;
the stopper holder is fixed on the stationary base; and
a restoring spring is provided between the stopper and the stopper holder; and the stopper is configured to fix the electrical device,
wherein the electrode holder is further provided with a bump with a rectangular section, and the bump is located between the two long slots.

2. The electrical device testing fixture of claim 1, wherein the two electrodes are provided with depressions on a top end apart from the stationary base and the electrode holder on opposing sides, in each of the depressions is disposed a probe for connecting the electrical device respectively.

3. The electrical device testing fixture of claim 1, wherein the electrodes are each provided with a through hole in a direction perpendicular to the stationary base, and the wires are routed and fixed in the through hole.

4. The electrical device testing fixture of claim 1, wherein the stationary base is of a cylinder structure and provided with four vertical scale marks on sidewall, and the four vertical scale marks are arranged evenly with an equal spacing therebetween.

5. The electrical device testing fixture of claim 1, wherein the electrode holder is of a cuboid structure and the two long slots are disposed symmetrically on the electrode holder.

6. An electrical device testing fixture, comprising a stationary base, an electrode holder, a negative electrode and a positive electrode, a stopper holder and a stopper, wherein
the stationary base is provided with two wire mounting holes penetrating therethrough, and wires are routed in the two wire mounting holes;
the electrode holder is fixed on the stationary base and provided with two independent long slots;
the two electrodes are held in the two long slots of the electrode holder respectively and movable in the long slots respectively; the two electrodes are electrically connected with corresponding wires respectively and an electrical device is connected therebetween;
the stopper holder is fixed on the stationary base; and
a restoring spring is provided between the stopper and the stopper holder; and the stopper is configured to fix the electrical device,
wherein the electrode holder is of a cuboid structure and the two long slots are disposed symmetrically on the electrode holder, and
wherein the electrode holder is further provided with a bump with a rectangular section, and the bump is located between the two long slots.

7. The electrical device testing fixture of claim 6, wherein each of the electrodes is provided with a through bolt hole in a direction perpendicular to the electrode holder, in the through bolt hole a bolt is provided; and the electrodes are fixed in the long slots by nut mating with bolts.

8. The electrical device testing fixture of claim 1, wherein each of the electrodes is provided with a through bolt hole in a direction perpendicular to the electrode holder, in the through bolt hole a bolt is provided; and the electrodes are fixed in the long slots by nut mating with bolts.

9. The electrical device testing fixture of claim 1, wherein the stopper holder is of a U shape structure and provided with a sliding groove at a bottom thereof; and the stopper is located in the U shape structure, and provided with protruding sliders on both sides that mate with the sliding groove.

10. The electrical device testing fixture of claim 9, wherein the stopper is provided with at least one cylindrical guiding post on a back end surface apart from the electrode, and the guiding post is disposed through the stopper holder and connected with the stopper holder via a bearing.

11. The electrical device testing fixture of claim 10, wherein the restoring spring is located between two guiding posts.

12. An electrical device testing fixture, comprising a stationary base, an electrode holder, a negative electrode and a positive electrode, a stopper holder and a stopper, wherein
the stationary base is provided with two wire mounting holes penetrating therethrough, and wires are routed in the two wire mounting holes;
the electrode holder is fixed on the stationary base and provided with two independent long slots;
the two electrodes are held in the two long slots of the electrode holder respectively and movable in the long slots respectively; the two electrodes are electrically connected with corresponding wires respectively and an electrical device is connected therebetween;
the stopper holder is fixed on the stationary base; and
a restoring spring is provided between the stopper and the stopper holder; and the stopper is configured to fix the electrical device,
wherein the stopper holder is of a U shape structure and provided with a sliding groove at a bottom thereof; and the stopper is located in the U shape structure, and provided with protruding sliders on both sides that mate with the sliding groove, and
wherein the stopper is provided with a lateral U-shape groove on a side that is apart from the stationary base.

13. The electrical device testing fixture of claim 1, wherein the restoring spring has one end fixed at a back end surface of the stopper and other end fixed at the stopper holder.

14. The electrical device testing fixture of claim 1, wherein the electrical device is connected between the two electrodes, the restoring spring is in its initial position and the stopper presses against the electrical device.

15. An electrical device testing fixture, comprising a stationary base, an electrode holder, a negative electrode and a positive electrode, a stopper holder and a stopper, wherein
the stationary base is provided with two wire mounting holes penetrating therethrough, and wires are routed in the two wire mounting holes;
the electrode holder is fixed on the stationary base and provided with two independent long slots;
the two electrodes are held in the two long slots of the electrode holder respectively and movable in the long slots respectively; the two electrodes are electrically connected with corresponding wires respectively and an electrical device is connected therebetween;
the stopper holder is fixed on the stationary base; and
a restoring spring is provided between the stopper and the stopper holder; and the stopper is configured to fix the electrical device,
wherein the stationary base is provided with at least one clamping hole, in which a corresponding clamping block is disposed.

16. An electrical device testing fixture, comprising a stationary base, an electrode holder, a negative electrode and a positive electrode, a stopper holder and a stopper, wherein
the stationary base is provided with two wire mounting holes penetrating therethrough, and wires are routed in the two wire mounting holes;
the electrode holder is fixed on the stationary base and provided with two independent long slots;
the two electrodes are held in the two long slots of the electrode holder respectively and movable in the long slots respectively; the two electrodes are electrically connected with corresponding wires respectively and an electrical device is connected therebetween;
the stopper holder is fixed on the stationary base; and
a restoring spring is provided between the stopper and the stopper holder; and the stopper is configured to fix the electrical device,
wherein the stopper is provided with a lateral U-shape groove on a side that is apart from the stationary base.

17. The electrical device testing fixture of claim 16, wherein the stopper is provided with a vertical opening groove in an area corresponding to the probe on a front end surface that is away from the electrodes.

18. The electrical device testing fixture of claim 17, wherein a scale mark is provided on a front end surface of the stopper that is away from the electrode, which is located on both sides of the opening groove.

19. The electrical device testing fixture of claim 1, wherein the electrical device is a light emitting diode.

* * * * *